US011442514B2

(12) United States Patent
Chen et al.

(10) Patent No.: US 11,442,514 B2
(45) Date of Patent: Sep. 13, 2022

(54) POWER SUPPLY UNIT WITH SOME DC-DC CONVERTERS LOCATED OUTSIDE THE ENCLOSURE AND INTEGRATED INTO CABLE HARNESS ASSEMBLY

(71) Applicant: HIGH POWER ELECTRONIC CO., LTD., Taipei (TW)

(72) Inventors: Chih-Ming Chen, Taipei (TW); Feng-Hsun Mo, Taipei (TW)

(73) Assignee: High Power Electronic Co., Ltd., Taipei (TW)

( * ) Notice: Subject to any disclaimer, the term of this patent is extended or adjusted under 35 U.S.C. 154(b) by 556 days.

(21) Appl. No.: 16/530,145

(22) Filed: Aug. 2, 2019

(65) Prior Publication Data

US 2021/0034122 A1 Feb. 4, 2021

(51) Int. Cl.
*G06F 1/26* (2006.01)
*H01B 7/08* (2006.01)
*H01B 7/00* (2006.01)
*H02M 3/156* (2006.01)
*H05K 5/00* (2006.01)
*G06F 1/18* (2006.01)

(52) U.S. Cl.
CPC .............. *G06F 1/26* (2013.01); *G06F 1/189* (2013.01); *G06F 1/266* (2013.01); *H01B 7/0045* (2013.01); *H01B 7/08* (2013.01); *H02M 3/156* (2013.01); *H05K 5/00* (2013.01); *H05K 5/0069* (2013.01); *G06F 1/18* (2013.01)

(58) Field of Classification Search
CPC . G06F 1/18; G06F 1/189; G06F 1/266; G06F 1/26; H01B 7/0045; H01B 7/08; H02M 3/156
See application file for complete search history.

(56) References Cited

U.S. PATENT DOCUMENTS

| 2008/0191552 | A1* | 8/2008 | Suzuki | G06F 1/30 307/23 |
| 2011/0006607 | A1* | 1/2011 | Kwon | H02J 1/102 307/66 |
| 2011/0019352 | A1* | 1/2011 | Kwon | G06F 1/181 361/679.02 |
| 2015/0123612 | A1* | 5/2015 | Ide | H02M 7/155 363/67 |
| 2019/0372344 | A1* | 12/2019 | Yew Lam | G06F 13/4221 |

* cited by examiner

*Primary Examiner* — Rafael O De Leon Domenech
(74) *Attorney, Agent, or Firm* — Rosenberg, Klein & Lee

(57) ABSTRACT

A power supply unit where the main DC voltage output rail is incorporated within the enclosure of the power supply unit and some DC voltage output rails and DC-DC converters are located outside the enclosure of the power supply unit close to or directly at the input of the system board and input of associated system peripheral via integration into a cable harness assembly, to negate the voltage drop on the cable harness assembly, resulting in a lower power loss across the cable harness assembly, leading to an improvement in combined power supply unit and cable harness assembly efficiency.

8 Claims, 4 Drawing Sheets

POWER SUPPLY UNIT WITH SOME DC-DC CONVERTERS LOCATED OUTSIDE THE ENCLOSURE AND INTEGRATED INTO CABLE HARNESS ASSEMBLY

FIELD OF THE INVENTION

The present invention is specifically directed to take advantage of the existing fault protection supervisory IC within a personal computer system power supply or gaming machine system power supply when supporting other external DC voltage rails, improving electrical performance aspects of power supply units for personal and gaming computers in terms of efficiency, voltage regulation and transient response performance, optimizing the cable harness solution and modular interface solution for the power supply of the personal computer system or gaming machine system.

BACKGROUND OF THE INVENTION

Personal computers and gaming machines use multiple DC output voltage power supply rails (see FIG. 1 for the power supply unit 1021 in the prior art) to correctly support system operation. The personal computer system and gaming machine system typically consists of a motherboard and associated supporting peripherals each of which requires a certain DC voltage input for correct operation including +12V, +5V, +3.3V, -12V, +5V (stand-by), etc. These voltages are typically derived from within a personal computer power supply or gaming machine power supply and fed to the motherboard and supporting peripherals via a transmission path such as cable harness which can be less than ideal. The voltage drops across the cable for the +12V DC output rail 1004, +5V DC output rail 1019, +3.3V DC output rails 1018 etc. leads to deterioration of overall power supply and system efficiency, deterioration of overall DC output voltage regulation and deterioration of step load transient response characteristics.

SUMMARY OF THE INVENTION

The primary objective of the present invention is to solve the abovementioned technical problem in the prior art. To achieve the objective, the present invention provides a power supply unit with some DC-DC converters located outside the enclosure and integrated into cable harness assembly. The power supply unit 1000, comprising: an enclosure 100; a main DC voltage output rail 104; a first branch DC voltage output rail 114; a second branch DC voltage output rail 115; and a supervisor IC 101; the power supply unit 1000 is characterized in that: the main DC voltage output rail 104 is incorporated within the enclosure 100, the supervisor IC 101 is internal or external to the enclosure 100, the first branch DC voltage output rail 114 and the second branch DC voltage output rail 115 are located outside the enclosure 100, wherein the first branch DC voltage output rail 114 and the second branch voltage DC output rail 115 are connected back to the supervisor IC 101, the first branch DC voltage output rail 114 is coupled to the main DC voltage output rail 104 through a first DC-DC converter 111, the second branch DC voltage output rail 115 is coupled to the main DC voltage output rail 104 through a second DC-DC converter 112, wherein the first DC-DC converter 111 and the second DC-DC converter 112 are located outside the enclosure 100.

Optionally, the power supply unit further comprising an additional DC voltage output rail 107, wherein the additional DC voltage output rail 107 is incorporated within the enclosure 100.

Optionally, the power supply unit further comprising a standby DC output rail 108, wherein the standby DC output rail 108 is incorporated within the enclosure 100.

Optionally, the main DC voltage output rail 104 is a +12V DC output rail, the first branch DC voltage output rail 114 is a +5V DC output rail, and the second branch DC voltage output rail 115 is a +3.3V DC output rail.

Optionally, the first branch DC voltage output rail 114 and the second branch DC voltage output rail 115 are located outside the enclosure 100 via integration into a cable harness assembly 113.

Optionally, the power supply unit further comprising a standby voltage source 500 incorporated within the enclosure 100; a first switch element 502 connected between the standby voltage source 500 and the standby DC output rail 108; a first control circuit 501 connected with the first switch element 502 and configured to switch on or switch off the second switch element 503; a second switch element 503 connected between first branch DC voltage output rail 114 and the standby DC output rail 108; and a second control circuit 504 connected with the second switch element 503 and configured to switch on or switch off the second switch element 503.

Optionally, a SATA cable harness 304, a SATA cable 305 or a SATA connector 306 is added to the DC cable harness assembly 113.

Optionally, a Peripheral cable harness 307, a Peripheral cable 308 or a Peripheral connector 309 is added to the DC cable harness assembly 113.

Optionally, a Floppy cable harness 310, a Floppy cable 311 or a Floppy connector 312 is added to the DC cable harness assembly 113.

Optionally, an additional cable 302, or an additional connector 303 is added to the DC cable harness assembly 113.

Compared with the power supply in prior art, the power supply of this present invention provides a better scheme for reducing the voltage drop on the cable harness assembly 113 associated with the first branch DC voltage output rail 114 and the second branch DC voltage output rail 115, resulting in a lower power loss across the cable harness assembly 113 which leads to an improvement in combined power supply unit 1000 and cable harness assembly 113 efficiency, improvement in overall DC output voltage regulation and improvement of step load transient response characteristics at the input to the system board 116 and at the input to the system peripheral 117.

BRIEF DESCRIPTION OF THE DRAWINGS

The present invention will be apparent to those skilled in the art by reading the following description of preferred embodiments thereof with reference to the drawings, in which.

Figure 1:
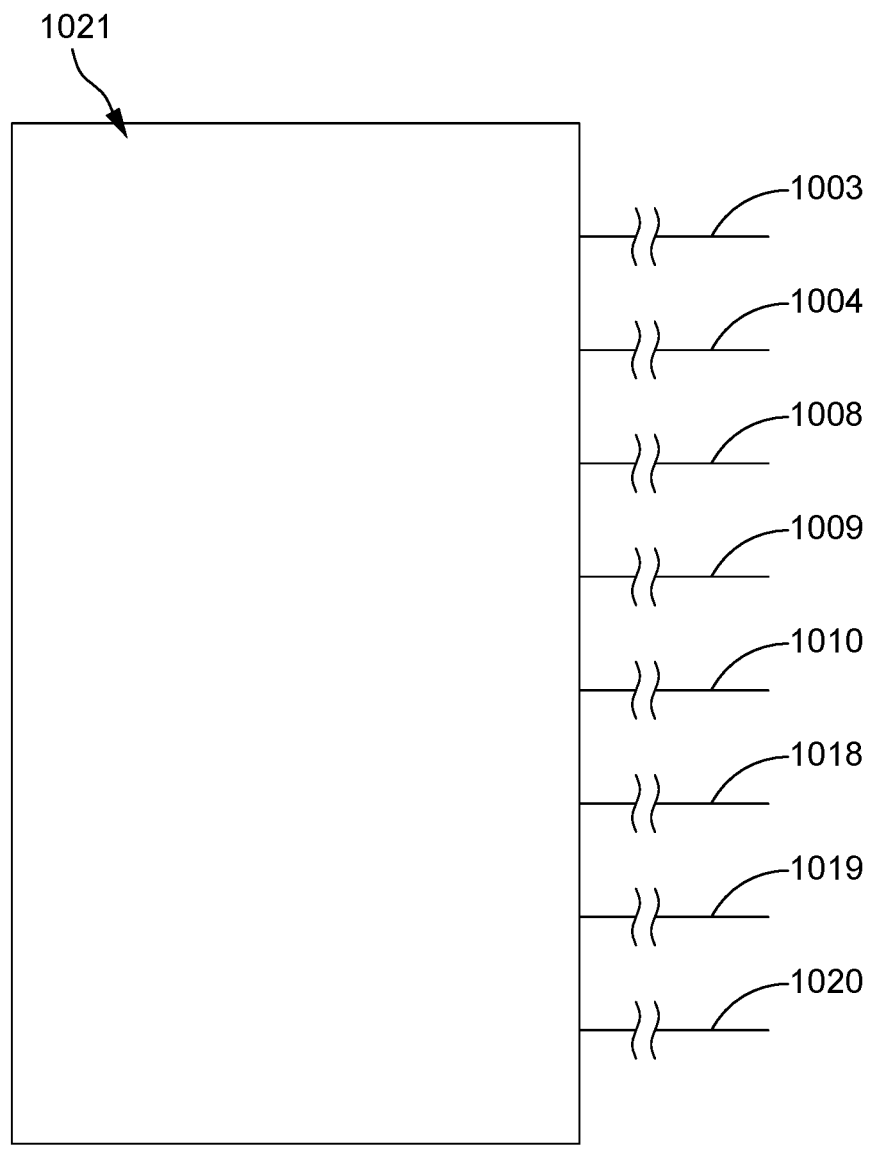
FIG. 1 is a schematic view showing a power supply in the prior art.

LIST OF REFERENCE NUMBERS FOR THE MAJOR ELEMENTS IN THE DRAWING 1000 power supply unit
100 enclosure
101 supervisor IC
102 first DC signal feedback path
103: PS-ON
104: main DC voltage output rail
105: Data communication
106: second DC signal feedback path
107: additional DC voltage output rail
108: standby DC output rail
109: −12V DC output rail
110: DC return
111: first DC-DC converter
112: second DC-DC converter
113: cable harness assembly
114: first branch DC voltage output rail
115: second branch DC voltage output rail
116: system board
117: system peripheral
118: power good
300: 24 pin ATX Connector Cable harness
301: 20+4 pin ATX Connector Cable harness
302: additional cable
303: additional connector
304: SATA cable harness
305: SATA cable
306: SATA connector
307: Peripheral cable harness
308: Peripheral cable
309: Peripheral connector
310: Floppy cable harness
311: Floppy cable
312: Floppy connector
500: standby voltage source
501: first switch control circuit
502: first switch element
503: second switch control circuit
504: second switch element
1021: power supply unit
1003: PS ON
1004: +12V DC output rail
1008: +5V standby output rail
1009: −12V DC output rail
1010: DC return
1018: +3.3V DC output rail
1019: +5V DC output rail
1020: power good

DETAILED DESCRIPTION OF THE PREFERRED EMBODIMENTS

Figure 2:
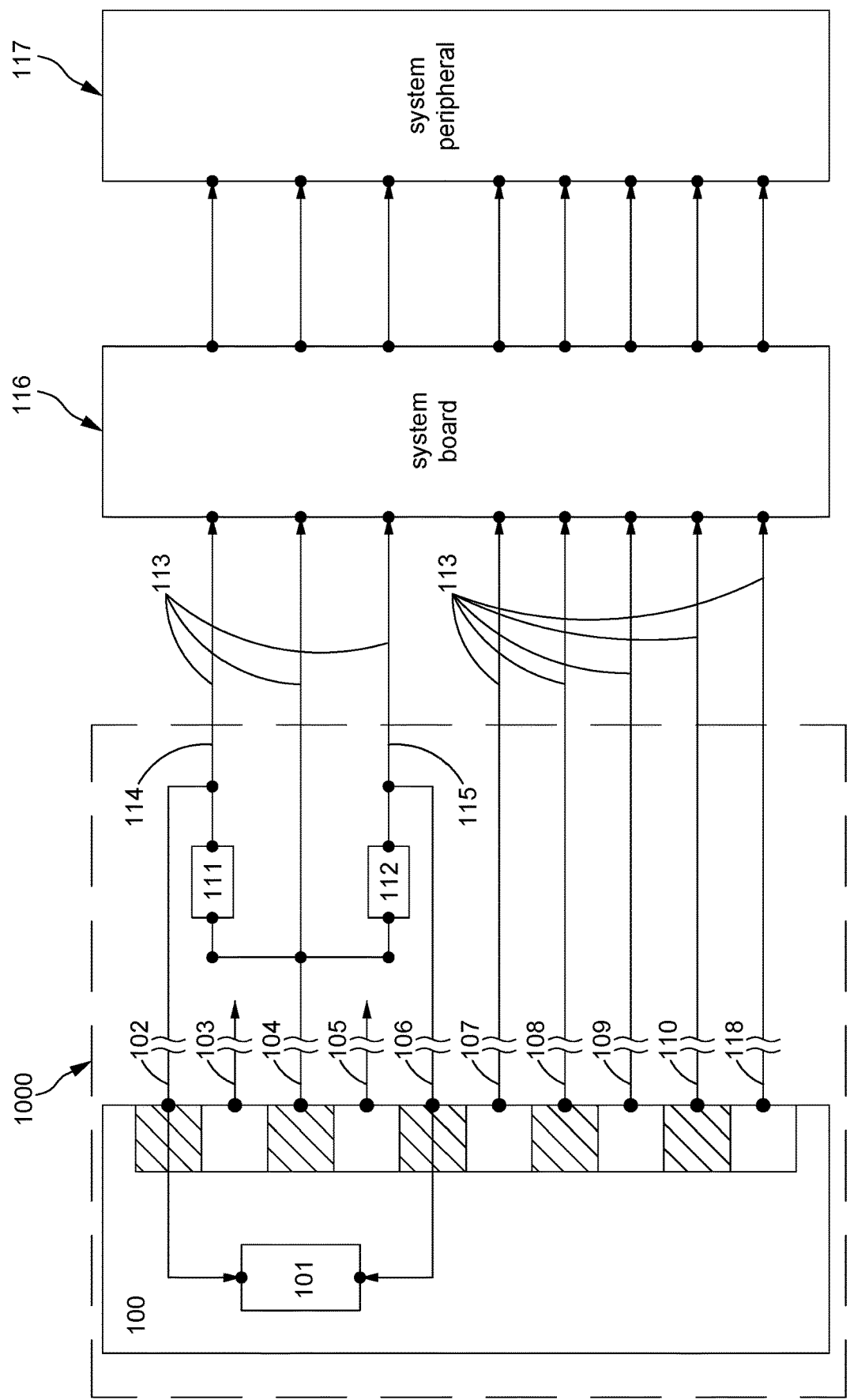
FIG. 2 is a schematic view showing an embodiment of the power supply unit of this present invention.

Referring to FIG. 2, the present invention provides a power supply unit with some DC-DC converters located outside the enclosure and integrated into cable harness assembly. The power supply unit 1000, comprising: an enclosure 100, a main DC voltage output rail 104, a first branch DC voltage output rail 114, a second branch DC voltage output rail 115; and a supervisor IC 101.

The power supply unit 1000 is characterized in that: the main DC voltage output rail 104 is incorporated within the enclosure 100; the supervisor IC 101 is internal or external to the enclosure 100; the first branch DC voltage output rail 114 and the second branch DC voltage output rail 115 are located outside the enclosure 100. The first branch DC voltage output rail 114 and the second branch voltage DC output rail 115 are connected back to the supervisor IC 101. The first branch DC voltage output rail 114 is coupled to the main DC voltage output rail 104 through a first DC-DC converter 111 and the second branch DC voltage output rail 115 is coupled to the main DC voltage output rail 104 through a second branch DC-DC converter 112, where the first DC-DC converter 111 and the second DC-DC converter 112 are located outside the enclosure 100.

The first DC-DC converter 111 and the second DC-DC converter 112 can be implemented in hardware via a Printed Circuit Board with wires attached, or a Printed Circuit Board module (Printed Circuit Board with plastic housing and wires or connectors attached).

The first branch DC voltage output rail 114 is connected back to the supervisor IC 101 of the power supply unit 100 via a first DC signal feedback path 102 and the second branch voltage DC output rail 115 are connected back to the supervisor IC 101 of the power supply unit 100 via a second DC signal feedback path 106, for the purpose of Power Fail (PF), Power Good (PG), Power OK (PWR OK) signaling associated with Overvoltage protection (OVP), Undervoltage protection (UVP), Overcurrent protection (OCP), Short circuit protection (SCP), Overpower protection (OPP), Overtemperature protection (OTP) and other fault protection (OFP). Where the power supply supervisor IC 101 can be internal or external to the enclosure 100, according to certain embodiments.

In an embodiment of the present invention, the main DC voltage output rail 104 is a +12V DC output rail, the first branch DC voltage output rail 114 is a +5V DC output rail, and the second branch DC voltage output rail 115 is a +3.3V DC output rail.

According to an embodiment of present invention, the power supply unit 1000 further comprises an additional DC output rail 107. The additional DC voltage output rail 107 is incorporated within the enclosure 100.

According to an embodiment of present invention, the power supply unit 1000 further comprises a standby DC output rail 108. The standby DC output rail 108 is incorporated within the enclosure 100. In an embodiment of the present invention, the output voltage of the standby DC output rail 108 is +5V.

According to an embodiment of the present invention, the first branch DC voltage output rail 114 and the second branch DC voltage output rail 115 are located outside the enclosure via integration into a cable harness assembly 113.

By means of locating the first DC-DC converter 111, first branch DC voltage output rail 114, the second DC-DC converter 112 and the second branch DC voltage output rail 115 outside the enclosure 100 of the power supply unit 1000 and close to or directly at the input of the system board 116 and input of associated system peripheral 117 via integration into a cable harness assembly 113, it would negate the voltage drop on the cable harness assembly 113 associated with the first branch DC voltage output rail 114 and the second branch DC voltage output rail 115, resulting in a lower power loss across the cable harness assembly 113 which leads to an improvement in combined power supply unit 1000 and cable harness assembly 113 efficiency, improvement in overall DC output voltage regulation and improvement of step load transient response characteristics at the input to the system board 116 and at the input to the system peripheral 117.

In another preferred embodiment, the first branch DC voltage output rail 114 and second branch DC voltage output rail 115 are located outside the power supply unit enclosure 100 via an external PCB module assembly (not shown), where the PCB module can be separate PCB or combined PCB for the first branch DC voltage output rail 114 and second branch DC voltage output rail 115.

In another preferred embodiment, the first branch DC voltage output rail 114 and second branch DC voltage output rail 115 are located outside the enclosure 100 via both the cable harness assembly 113 and the external PCB module.

In abovementioned or other embodiments, the cable harness assembly 113, the external PCB module assembly or other DC power transmission paths or methods can support analog or digital data communication.

In another embodiment, the first branch DC voltage output rail 114 and the second branch DC voltage output rail 115 are located outside the enclosure 100 of the power supply unit 1000 and connect to the system board 116 and system peripheral 117 via similar or other DC power transmission paths and methods, wherein the similar or other DC power transmission paths and methods can support analog data communication or digital data communication or both analog and digital data communication.

Figure 3:
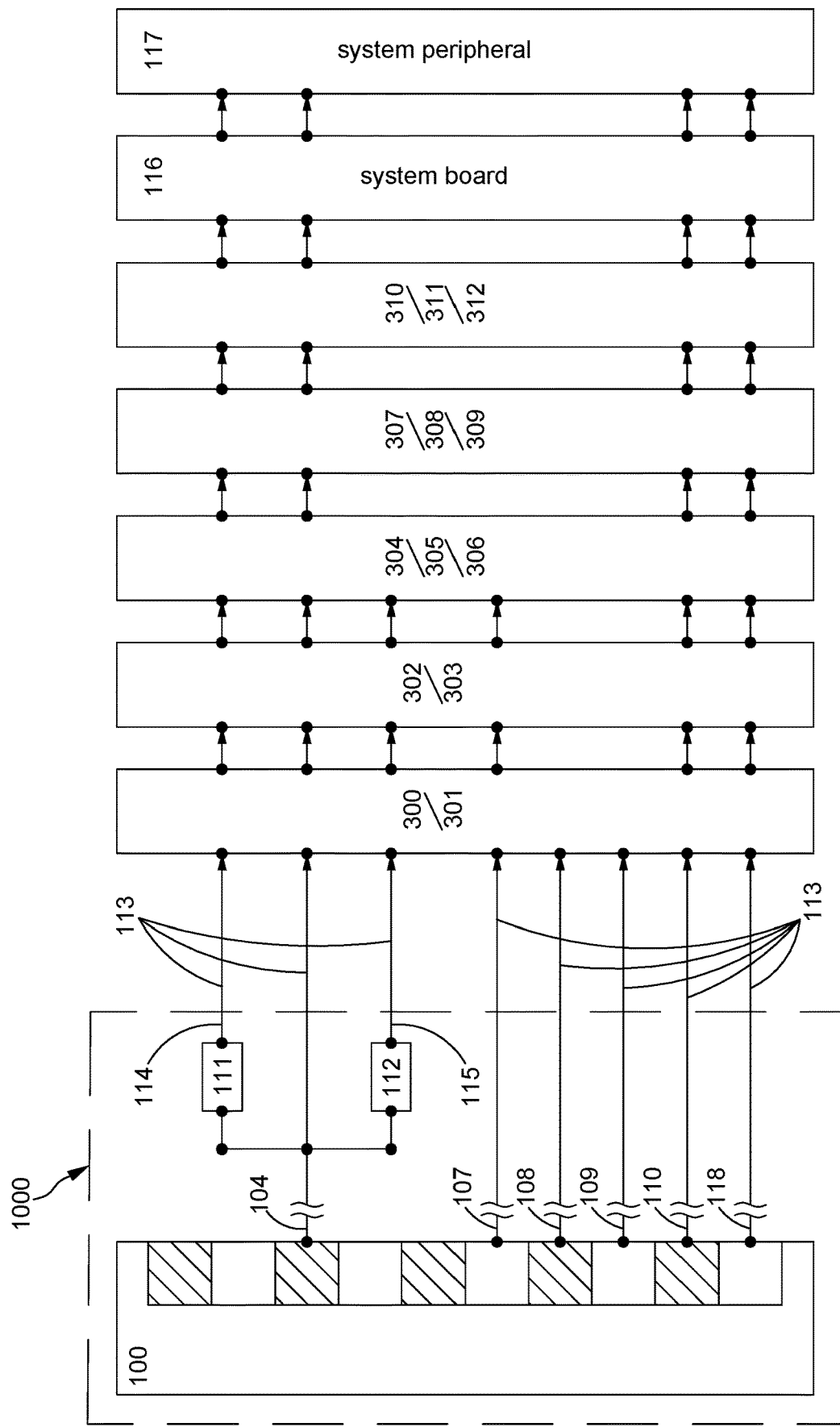
FIG. 3 is a schematic view showing another embodiment of the power supply unit of this present invention.

Referring to FIG. 3, according to certain embodiments of the present invention, additional cable 302 or connector 303 can be added to the external cable harness assembly 113 or external PCB module assembly or both the cable harness assembly 113 and the external PCB module assembly.

Optionally, additional SATA cable harness 304, SATA cable 305, or SATA connector 306 can be added to the cable harness assembly 113 or external PCB module assembly.

Optionally, additional Floppy cable harness 310, Floppy cable 311, Floppy connector 312 or the combination thereof can be added to the external cable harness assembly 113 or the external PCB module assembly or both the cable harness assembly 113 and the external PCB module assembly.

Optionally, additional Peripheral cable harness 307, Peripheral cable 308 or Peripheral connector 309 can be added to the external cable harness assembly 113 or the external PCB module assembly or both the cable harness assembly 113 and the external PCB module assembly.

According to certain embodiments, these SATA, Peripheral, Floppy or other harness, cable, connector at the end or close to the end of the existing 24 pin ATX Connector Cable harness 300 or 20+4 pin ATX Connector Cable harness 301 eliminate the extra cables required to connect to the power supply unit 1000 and dramatically shorten the length of the SATA, Peripheral, Floppy or other cables needed to connect to the associated system peripherals 117, in addition allows for a neater and better routed cable assembly to the associated system peripherals 117.

According to certain embodiments, the power electronics solution can be supported by analog control methods or digital control methods, or analog and digital control methods which are independent, interchangeable or combined.

Figure 4:
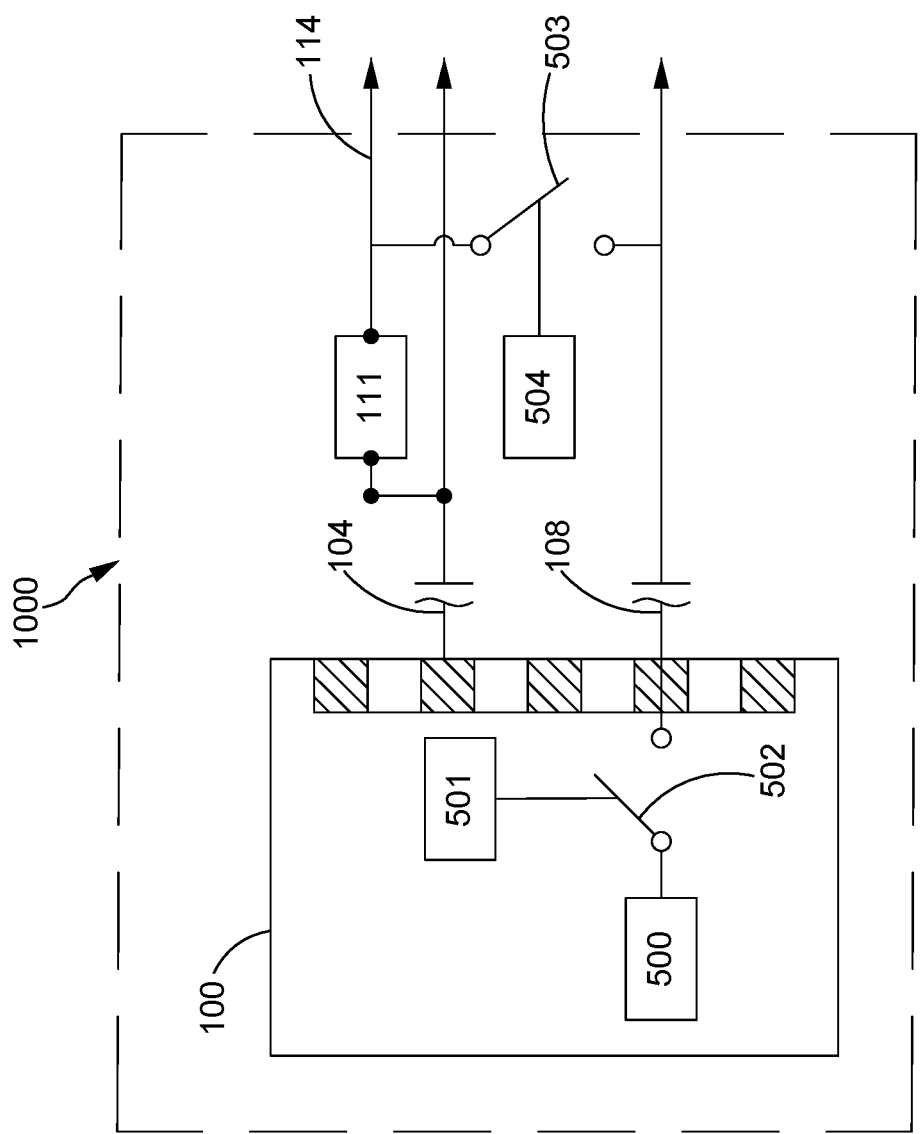
FIG. 4 is a schematic view showing another embodiment of the power supply unit of this present invention.

Referring to FIG. 4, in another embodiment of present invention, the power supply unit 1000 further comprises an standby voltage source 500 incorporated within the enclosure 100; a first switch element 502 connected between the standby voltage source 500 and the standby DC output rail 108; a first control circuit 501 connected with the first switch element 502 and configured to switch on or switch off the first switch element 502; a second switch element 503 connected between first branch DC voltage output rail 114 and the standby DC output rail 108; and a second control circuit 504 connected with the second switch element 503 and configured to switch on or switch off the second switch element 503. By this arrangement, the standby DC output rail 108 can be turned off via the first switch element 502 and the first control circuit 501 and replaced by the first branch DC voltage output rail 114 via the second control circuit 504 and the second switch element 503. In an embodiment of the present invention, the output voltage of the standby voltage source 500 is +5V.

It should be understood that the indefinite article "a" or "an" in the claims and the specification does not exclude a plurality and more than one of the elements can be present, as the case may be. Where the noun of the element takes singular form, it does not intend to limit the number of that element to "one" or "only one", unless otherwise clearly required.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A power supply unit (1000) with some DC-DC converters located outside the enclosure and integrated into cable harness assembly, the power supply unit (1000) comprising:
    an enclosure (100);
    a main DC voltage output rail (104);
    a first branch DC voltage output rail (114);
    a second branch DC voltage output rail (115);
    an additional DC voltage output rail (107) being incorporated within the enclosure (100); and
    a supervisor IC (101);
    the power supply unit (1000) is characterized in that:
    the main DC voltage output rail (104) is incorporated within the enclosure (100), the supervisor IC (101) is internal or external to the enclosure (100), the first branch DC voltage output rail (114) and the second branch DC voltage output rail (115) are located outside the enclosure (100), wherein the first branch DC voltage output rail (114) and the second branch voltage DC output rail (115) are connected back to the supervisor IC (101), the first branch DC voltage output rail (114) is coupled to the main DC voltage output rail (104) through a first DC-DC converter (111), the second branch DC voltage output rail (115) is coupled to the main DC voltage output rail (104) through a second DC-DC converter (112), wherein the first DC-DC converter (111) and the second DC-DC converter (112) are located outside the enclosure (100) via integration into a cable harness assembly (113).

2. The power supply unit according to claim 1, further comprising a standby DC output rail (108), wherein the standby DC output rail (108) is incorporated within the enclosure (100).

3. The power supply unit according to claim 1, wherein the main DC voltage output rail (104) is a +12V DC output rail, the first branch DC voltage output rail (114) is a +5V DC output rail, and the second branch DC voltage output rail (115) is a +3.3V DC output rail.

4. The power supply unit according to claim 2, further comprising:
    a standby voltage source (500) incorporated within the enclosure (100);
    a first switch element (502) connected between the standby voltage source (500) and the standby DC output rail (108);

a first control circuit (501) connected with the first switch element (502) and configured to switch on or switch off the second switch element (503);

a second switch element (503) connected between first branch DC voltage output rail (114) and the standby DC output rail (108); and a second control circuit (504) connected with the second switch element (503) and configured to switch on or switch off the second switch element (503).

5. The power supply unit according to claim 1, wherein a SATA cable harness (304), a SATA cable (305) or a SATA connector (306) is added to the DC cable harness assembly (113).

6. The power supply unit according to claim 1, wherein a Peripheral cable harness (307), a Peripheral cable (308) or a Peripheral connector (309) is added to the DC cable harness assembly (113).

7. The power supply unit according to claim 1, wherein a Floppy cable harness (310), a Floppy cable (311) or a Floppy connector (312) is added to the DC cable harness assembly (113).

8. The power supply unit according to claim 1, wherein an additional cable (302), or an additional connector (303) is added to the DC cable harness assembly (113).

\* \* \* \* \*